(12) United States Patent  
Suzuki et al.

(10) Patent No.: US 11,963,416 B2  
(45) Date of Patent: Apr. 16, 2024

(54) DISPLAY DEVICE

(71) Applicant: SHARP KABUSHIKI KAISHA, Sakai (JP)

(72) Inventors: Nobuhiko Suzuki, Sakai (JP); Tomoo Furukawa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 402 days.

(21) Appl. No.: 17/603,321

(22) PCT Filed: Apr. 24, 2019

(86) PCT No.: PCT/JP2019/017445  
§ 371 (c)(1),  
(2) Date: Oct. 12, 2021

(87) PCT Pub. No.: WO2020/217343  
PCT Pub. Date: Oct. 29, 2020

(65) Prior Publication Data  
US 2022/0208947 A1 Jun. 30, 2022

(51) Int. Cl.  
*H10K 59/131* (2023.01)

(52) U.S. Cl.  
CPC .............................. *H10K 59/1315* (2023.02)

(58) Field of Classification Search  
CPC .................................................. H10K 59/1315  
USPC ............................................................ 257/40  
See application file for complete search history.

(56) References Cited

U.S. PATENT DOCUMENTS

| | | | |
|---|---|---|---|
| 2004/0017160 A1* | 1/2004 | Sagawa | H01J 9/241 |
| | | | 315/169.1 |
| 2007/0229433 A1* | 10/2007 | Jang | G09G 3/3677 |
| | | | 345/96 |
| 2013/0234917 A1 | 9/2013 | Lee | |
| 2014/0071030 A1 | 3/2014 | Lee | |
| 2014/0240521 A1 | 8/2014 | Kwak | |
| 2018/0069057 A1 | 3/2018 | Lee | |
| 2019/0333970 A1 | 10/2019 | Lee | |
| 2020/0394955 A1 | 12/2020 | Lee | |

FOREIGN PATENT DOCUMENTS

| | | |
|---|---|---|
| JP | 2018-120864 A | 8/2018 |
| KR | 20140108027 A | 9/2014 |

* cited by examiner

*Primary Examiner* — Xia L Cross  
(74) *Attorney, Agent, or Firm* — ScienBiziP, P.C.

(57) ABSTRACT

A first pixel circuit and a second pixel circuit are connected to a first data signal line. A third pixel circuit and a fourth pixel circuit are connected to a second data signal line. The first data signal line is connected to a first connection wire provided to a frame region. The second data signal line is connected to a second connection wire provided to the frame region. A sum of resistance values of the first data signal line and the first connection wire is smaller than a sum of resistance values of the second data signal line and the second connection wire.

19 Claims, 12 Drawing Sheets

DISPLAY DEVICE

TECHNICAL FIELD

The present disclosure relates to a display device.

BACKGROUND ART

Patent Document 1 discloses a configuration in which red sub-pixels and blue sub-pixels are alternately arranged in one column, and green sub-pixels are arranged in another column.

CITATION LIST

Patent Literature

[Patent Document 1] Japanese Unexamined Patent Application Publication No. 2018-120864

SUMMARY OF INVENTION

Technical Problem

In the arrangement of the sub-pixels disclosed in Patent Document 1, the red sub-pixels and the blue sub-pixels are connected to one data signal line, and the green sub-pixels are connected to another data signal line. Such an arrangement develops a difficulty in setting white balance (i.e. white is likely to appear not neutral when presented).

Solution to Problem

A display device according to an aspect of the present disclosure includes: a display region, a frame region provided to surround the display region, and a terminal unit provided to an end of the frame region; a plurality of data signal lines extending in a column direction, and a plurality of scan signal lines intersecting with the data signal lines and extending in a row direction; a scan control circuit included in the frame region and provided along at least one side of the display region in the column direction, the scan control circuit inputting scan signals into the scan signal lines; and a plurality of pixel circuits provided to correspond to the intersections of the data signal lines and the scan signal lines. The pixel circuits includes a plurality of groups each including: a first pixel circuit glowing in a first color; a second pixel circuit adjacent to the first pixel circuit and glowing in a second color different from the first color; a third pixel circuit adjacent to the first pixel circuit and glowing in a third color different from the first color and the second color; and a fourth pixel circuit adjacent to the third pixel circuit and glowing in the third color. In each of the groups, the first pixel circuit and the second pixel circuit are connected to a first data signal line, the third pixel circuit and the fourth pixel circuit are connected to a second data signal line, the first pixel circuit and the third pixel circuit are connected to a first scan signal line, the second pixel circuit and the fourth pixel circuit are connected to a second scan signal line, the first data signal line is connected to a first connection wire provided to the frame region, the second data signal line is connected to a second connection wire provided to the frame region, the first data signal line and the second data signal line are included in the data signal lines, and the first scan signal line and the second scan signal line are included in the scan signal lines. The groups include a first group to which the first data signal line, the first connection wire, the second data signal line, and the second connection wire correspond. A sum of resistance values of the first data signal line and the first connection wire is smaller than a sum of resistance values of the second data signal line and the second connection wire.

Advantageous Effects

An aspect of the present disclosure makes it possible to facilitate setting of white balance and keep from presenting non-neutral white.

DESCRIPTION OF EMBODIMENTS

FIG. 1(a) is a schematic plan view illustrating a configuration of a display device in this embodiment. FIG. 1(b) is a cross-sectional view illustrating the configuration of the display device.

Figure 1:
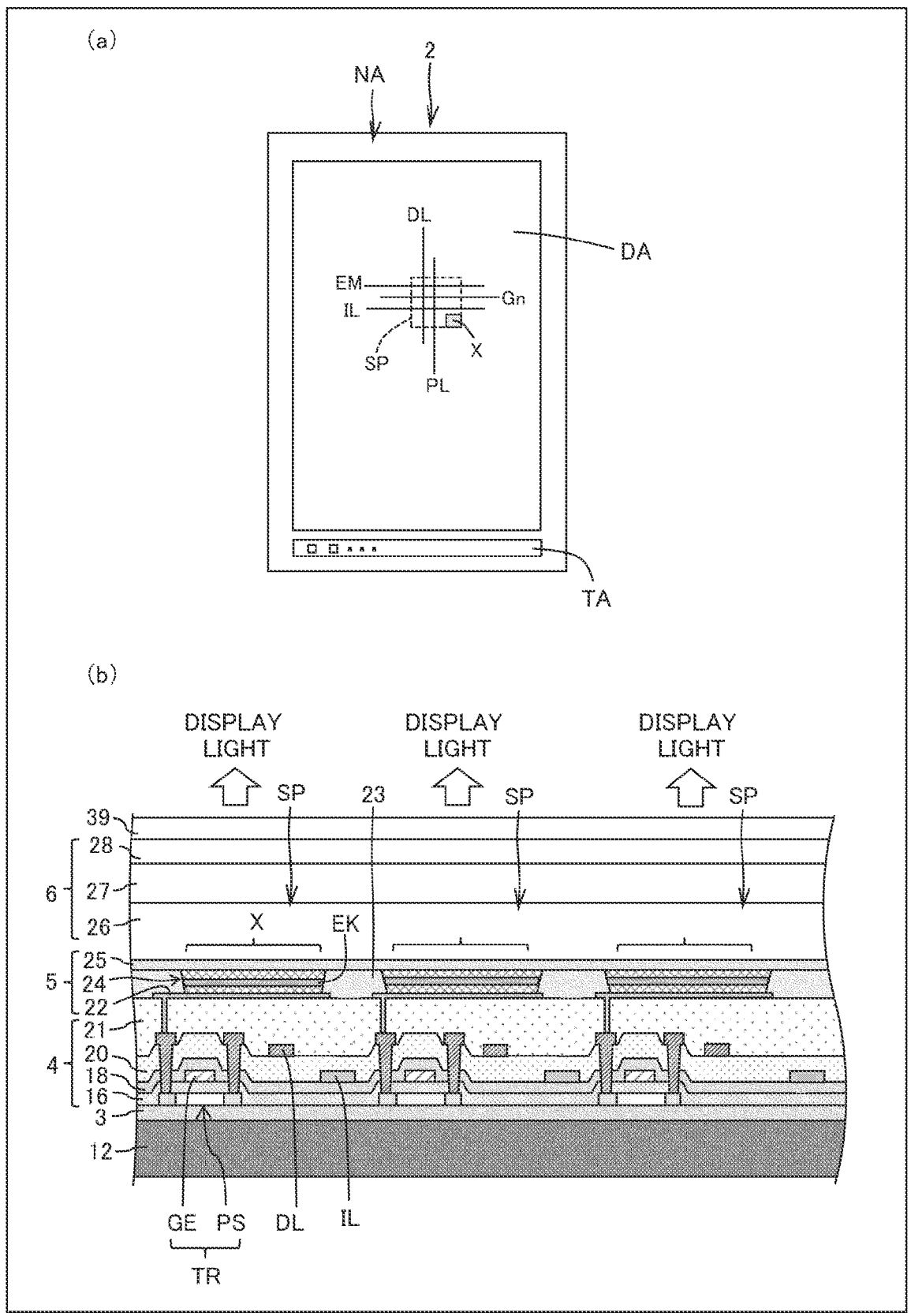
FIG. 1(a) is a schematic plan view illustrating a configuration of a display device in this embodiment.
FIG. 1(b) is a cross-sectional view illustrating the configuration of the display device.

As illustrated in FIG. 1, a display device 2 includes: a barrier layer 3; a thin-film transistor layer 4; a light-emitting element layer 5 of a top-emission type (i.e. emitting light upwards); and a sealing layer 6, all of which are formed on a substrate 12 in the stated order. The display device 2 includes a display region DA in which a plurality of sub-pixels SP are formed. Each of the sub-pixels SP includes a light-emitting element X. The display region DA is surrounded with a frame region NA provided with a terminal unit TA.

The substrate 12 is a glass substrate or a flexible base material mainly made of such resin as polyimide. The substrate 12 can be formed of, for example, two polyimide films and an inorganic film sandwiched therebetween. The barrier layer (an undercoat layer) 3 is an inorganic insulating layer blocking intrusion of such foreign objects as water and oxygen. The barrier layer 3 can be formed of, for example, silicon nitride and silicon oxide.

As illustrated in FIG. 1(b), the thin-film transistor layer 4 includes: a semiconductor layer PS above the barrier layer 3; a gate insulating film 16 above the semiconductor layer PS; a first wiring layer (including a gate electrode GE) above the gate insulating film 16; a first interlayer insulating film 18 above the first wiring layer; a second wiring layer (including an initialization wire IL) above the first interlayer insulating film 18; a second interlayer insulating film 20 above the second wiring layer; a third wiring layer (including a data signal line DL) above the second interlayer insulating film 20; and a planarization film 21 above the third wiring layer.

The semiconductor layer PS is made of, for example, low-temperature polysilicon (LTPS). A transistor TR is formed to include the gate electrode GE and the semiconductor layer PS. The semiconductor layer PS may have a region to be conductive except a channel region of the transistor.

Each of the first wiring layer, the second wiring layer, and the third wiring layer may be a monolayer film made of at least one of such metals as, for example, aluminum, tungsten, molybdenum, tantalum, chromium, titanium, and copper, or a multilayer formed of these metals.

Each of the gate insulating film 16, the first interlayer insulating film 18, and the second interlayer insulating film 20 can be a silicon oxide ($SiO_x$) film, or a silicon nitride ($SiN_x$) film formed by, for example, chemical vapor deposition (CVD), or can be a multilayer film including these films. The planarization film 21 can be formed of, for example, such an applicable organic material as polyimide and acrylic resin.

The light-emitting element layer 5 includes: a first electrode (a lower electrode) 22 above the planarization film 21; an edge cover film 23, of insulation, covering an edge of the first electrode 22; an electroluminescence (EL) layer 24 above the edge cover film 23; and a second electrode (an upper electrode) 25 above the EL layer 24. The edge cover film 23 is made of, for example, such an organic material as polyimide and acrylic resin. The organic material is applied and then patterned by photolithography to form the edge cover film 23.

As illustrated in FIG. 1, the light-emitting element layer 5 includes a plurality of light-emitting elements X emitting different colors. Each of the light-emitting elements includes: the first electrode 22 and the EL layer 24 (including a light-emitting layer EK) each shaped into an island; and the second electrode 25. The second electrode 25 is a common electrode shaped into a monolithic form in common among the light-emitting elements.

The light-emitting element X may be, for example, an organic light-emitting diode (OLED) including an organic layer as a light-emitting layer, or a quantum-dot light-emitting diode (QLED) including a quantum-dot layer as a light-emitting layer.

The EL layer 24 includes a hole-injection layer, a hole-transport layer, the light-emitting layer EK, an electron-transport layer, and an electron-injection layer stacked on top of another in the stated order from below. Using, for example, vapor deposition, ink-jet printing, or photolithography, the light-emitting layer is formed to have a shape of an island at an opening (for each of the sub-pixels) of the edge cover film 23. The other layers are shaped into islands or a monolithic form (a common layer). The EL layer 24 may omit one or more of the hole-injection layer, the hole-transport layer, the electron-transport layer, and the electron-injection layer.

The first electrode 22 (an anode), which reflects light, is formed of, for example, a stack of indium tin oxide (ITO) and either silver (Ag) or an alloy containing Ag. The second electrode 25 (a cathode), which is transparent to light, is formed of, for example, a thin film made of such metal as an alloy of magnesium and silver.

If the light-emitting element X is an OLED, holes and electrons recombine together in the light-emitting layer EK by a drive current between the first electrode 22 and the second electrode 25, which forms an exciton. While the exciton transforms to the ground state, light is released. If the light-emitting element X is a QLED, holes and electrons recombine together in the light-emitting layer EK by a drive current between the first electrode 22 and the second electrode 25, which forms an exciton. While the exciton transforms from the conduction band level to the valence band level, light is released.

In FIG. 1(b), the sealing layer 6 covering the light-emitting element layer 5 prevents such foreign objects as water and oxygen from penetrating into the light-emitting element layer 5. The sealing layer 6 can include, for example: two layers of inorganic sealing films 26 and 28; and an organic film 27 formed therebetween.

Figure 2:
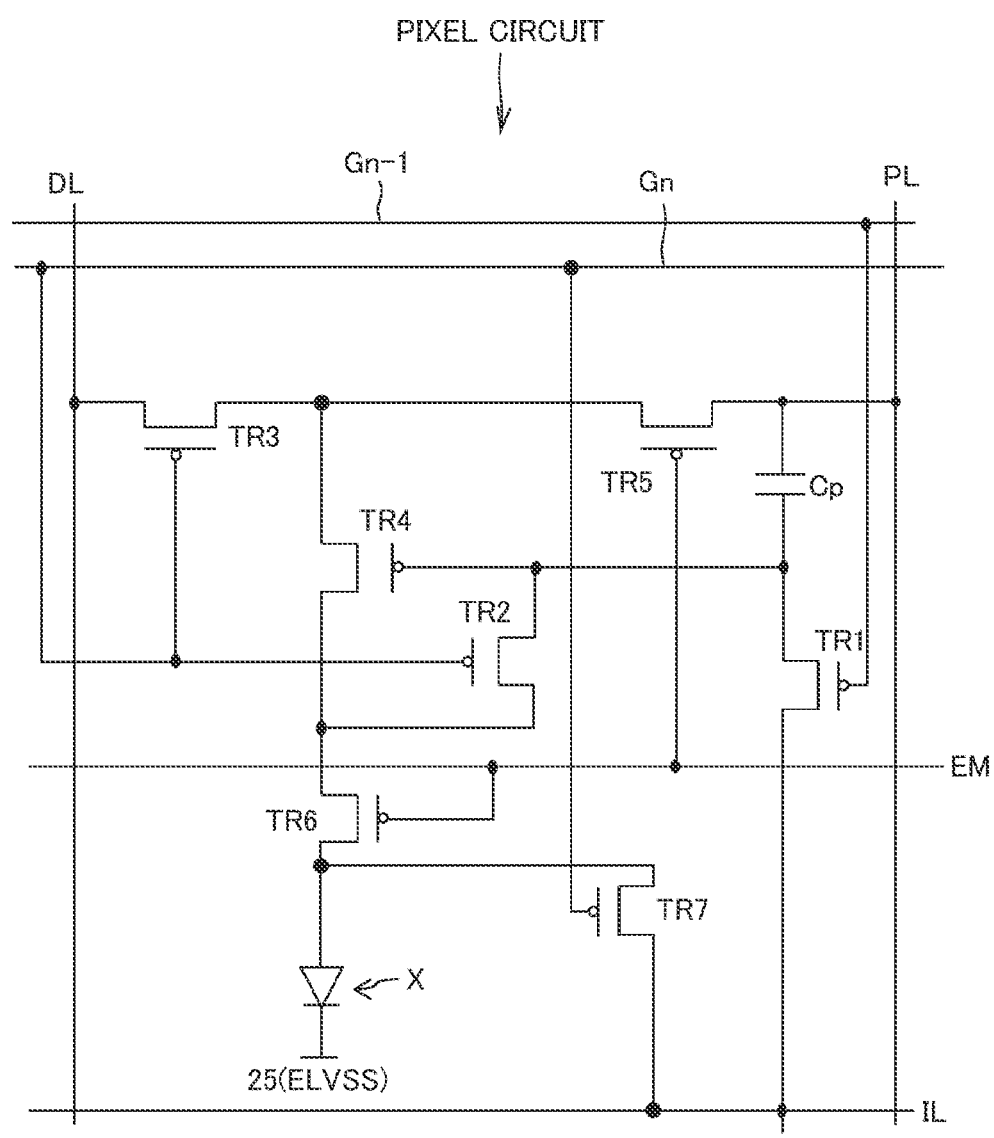
FIG. 2 is a circuit diagram illustrating an example of a pixel circuit.

FIG. 2 is a circuit diagram illustrating an example of a pixel circuit. In the display region DA of FIG. 1, a light-emitting element and a pixel circuit to control this light-emitting element are provided for each of sub-pixels SP. This pixel circuit and a wire connected to this pixel circuit are formed in the thin-film transistor layer 4. Note that the pixel circuit in FIG. 2 is an example, and can include various other features.

The pixel circuit in FIG. 2 includes: the light-emitting element X; a capacitance element Cp; a first initialization transistor TR1 having a gate terminal connected to a scan signal line Gn−1 at a previous stage (n−1-th stage); a threshold control transistor TR2 having a gate terminal connected to a scan signal line Gn at the stage of the threshold control transistor TR2 itself (n-th stage); a write control transistor TR3 having a gate terminal connected to the scan signal line Gn at the stage of write control transistor TR3 itself (n-th stage); a drive transistor TR4 controlling a current of the light-emitting element X; a power source supply transistor TR5 having a gate terminal connected to a light-emission control line EM (n-th stage); a light-emission control transistor TR6 having a gate terminal connected to the light-emission control line EM (n-th stage); and a second initialization transistor TR7 having a gate terminal connected to the scan signal line Gn at the stage of the second initialization transistor TR7 itself (n-th stage).

The drive transistor TR4 has a gate terminal connected to a high-voltage power source line PL through the capacitive element Cp, and to an initialization power source line IL through the first initialization transistor TR1. The drive transistor TR4 has a source terminal connected to the data signal line DL through the write control transistor TR3, and to the high-voltage power source line PL through the power source supply transistor TR5. The drive transistor TR4 has a drain terminal connected to an anode of the light-emitting element X through the light-emission control transistor TR6, and to the gate terminal of the drive transistor TR4 through the threshold control transistor TR2. The anode of the light-emitting element X is connected to the initialization power source line IL through the second initialization transistor TR7. The initialization power source line IL and a cathode 25 (a common electrode) of the light-emitting element X are supplied with, for example, the same low-voltage power supply (ELVSS).

First Embodiment

Figure 3:
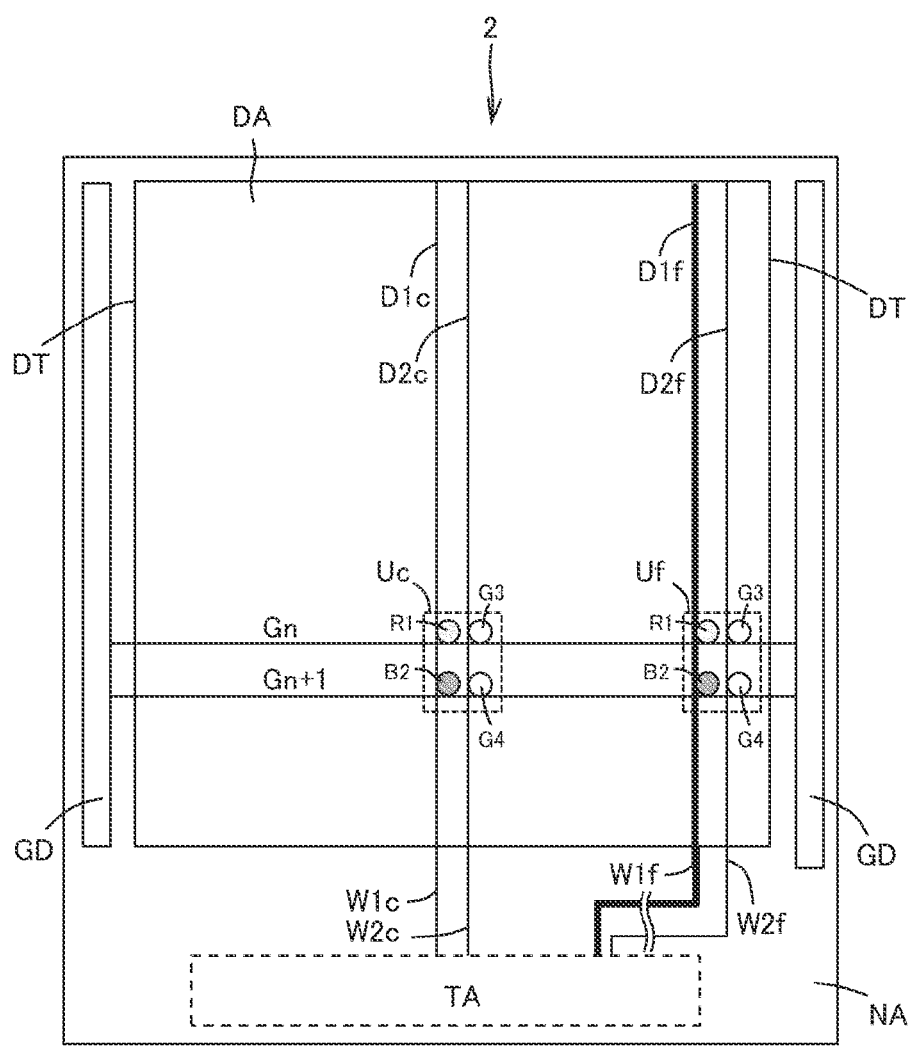
FIG. 3 is a plan view illustrating a configuration of a display device in a first embodiment.

Hereinafter, the term "connection" includes the meaning of "electrical connection" unless otherwise noted. FIG. 3 is a plan view illustrating a configuration of a display device in a first embodiment. As illustrated in FIG. 3, the display device 2 in the first embodiment includes: data signal lines D1c and D2c, and D1f and D2f extending in a column direction; and scan signal lines Gn and Gn+1 intersecting with the data signal lines D1c and D2c, and D1f and D2f, and extending in a row direction. The frame region NA includes scan control circuits GD each provided along one of two sides of the display region DA in a column direction (longitudinal two sides). The scan control circuits GD input scan signals into the scan signal lines.

The display region DA includes groups (Uf and Uc) each including: a first pixel circuit R1 glowing in a first color (e.g. red); a second pixel circuit B2 adjacent to the first pixel circuit R1 in the column direction, and glowing in a second color (e.g. blue) different from the first color; a third pixel circuit G3 adjacent to the first pixel circuit R1 in the row direction, and glowing in a third color (e.g. green) different from the first and second colors; and a fourth pixel circuit G4 adjacent to the third pixel circuit G3 in the column direction and glowing in the third color (e.g. green). Of the groups illustrated in FIG. 3, the second group Uc is farther away from display region ends DT in the row direction than the first group Uf is.

The first group Uf is configured, for example, as follows: The first pixel circuit R1 and the second pixel circuit B2 are connected to the first data signal line D1f. The third pixel circuit G3 and the fourth pixel circuit G4 are connected to the second data signal line D2f. The first pixel circuit R1 and the third pixel circuit G3 are connected to the first scan signal line Gn. The second pixel circuit B2 and the fourth pixel circuit G4 are connected to the second scan signal line Gn+1. The first data signal line D1f is connected to a first connection wire Wlf (a first connection wire corresponding to the first group Uf) provided to the frame region NA. The second data signal line D2f is connected to a second connection wire W2f (a second connection wire corresponding to the first group Uf) provided to the frame region NA. A sum of resistance values of the first data signal line D1f and the first connection wire Wlf is smaller than a sum of resistance values of the second data signal line D2f and the second connection wire W2f. For example, the first data signal line Df1 is wider than the second data signal line D2f, and the first connection wire W1f is wider than the second connection wire W2f. The first connection wire Wlf and the second connection wire W2f are connected to the terminal unit TA.

Figure 4:
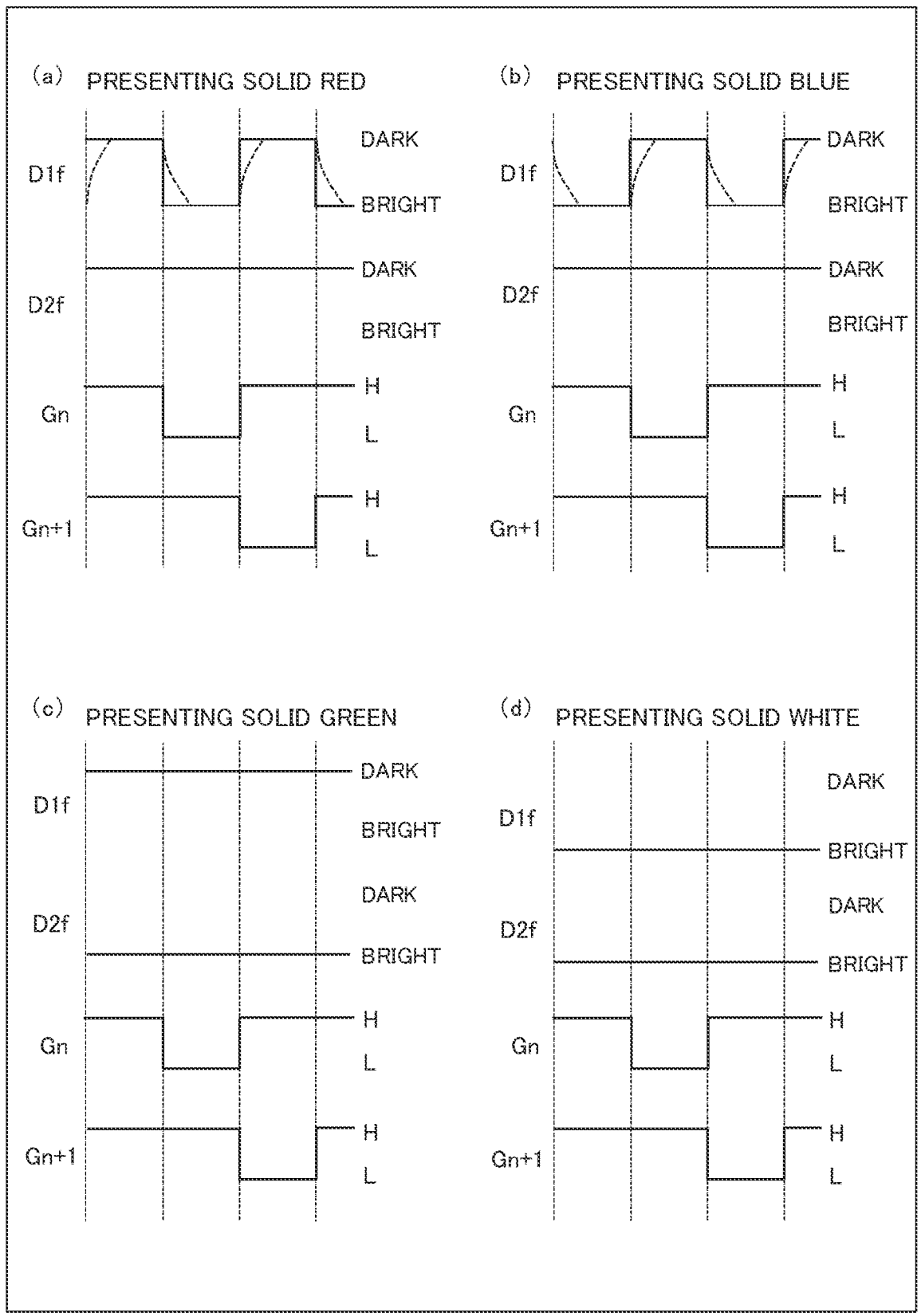
FIG. 4 is a timing diagram illustrating how to drive the display device when a display region presents a solid color.

FIG. 4 is a timing diagram illustrating how to drive the display device when the display region presents a solid color. When solid red is presented as illustrated in FIG. 4(a) and solid blue is presented as illustrated in FIG. 4(b), the data signal input into the first data signal line D1f has an AC waveform (bright and dark). Due to parasitic resistance and parasitic capacitance of the first data signal line D1f, a potential waveform of the data signal line D1f becomes dull as indicated by a broken line. Meanwhile, when solid green is presented as illustrated in FIG. 4(c), the data signal input into the second data signal line D2f has a DC waveform (bright). Hence, the potential waveform of the data signal line D2f does not become dull. Hence, when a red data signal is corrected by the presentation of the solid red, a blue data signal is corrected by the presentation of the solid blue, and a green data signal is corrected by the presentation of the solid green, a white balance is lost in the presentation of solid white (e.g. red light and blue light shift toward a higher luminance range), and the presented white could appear not neutral (e.g. purplish). This is because when the solid white is presented as illustrated in FIG. 4(d), the data signal input into the first data signal line D1f has the DC waveform (bright), and the potential waveform does not become dull.

In the first group Uf of the first embodiment, the sum of the resistance values of the first data signal line D1f and the first connection wire W1f is smaller than the sum of the resistance values of the second data signal line D2f and the second connection wire W2f. Accordingly, the potential waveform of the first data signal line D1f becomes less dull in the presentation of the solid red and the solid blue, keeping from presenting non-natural solid white.

As to the first data signal line D1c, the second data signal line D2c, the first connection wire W1c, and the second connection wire W2c all of which correspond to the second group Uc, the first data signal line D1c and the second data signal line D2c may be the same in resistance value (e.g. the same in width). Moreover, the first connection wire W1c and the second connection wire W2c may be the same in resistance value (e.g. the same in width). This is because the color appears definitely at an end of the display region (i.e. the first group Uf). Here, the first data signal line D1f corresponding to the first group Uf is smaller in resistance value (e.g. wider) than the first data signal line D1c corresponding to the second group Uc. The first connection wire W1f corresponding to the first group Uf is smaller in resistance value (e.g. wider) than the first connection wire W1c corresponding to the second group Uc.

Note that, in other groups including the second group Uc, the first data signal line (D1c) may be smaller in resistance value (e.g. wider) than the second data signal line (D2c). Likewise, in other groups including the second group Uc, the first connection wire (W1c) may be smaller in resistance value (e.g. wider) than the second connection wire (W2c). Here, in other groups including the second group Uc, the first data signal line (D1c) may be the same in resistance value (e.g. the same in width) as the first data signal line (D1f) of the first group Uf. Likewise, in other groups including the second group Uc, the first connection wire (W1c) may be the same in resistance value (e.g. the same in width) as the first connection wire (W1f) of the first group Uf.

Moreover, in the first group Uf of this example, the sum of the resistance values of the first data signal line D1f and the first connection wire W1f is smaller than the sum of the resistance values of the second data signal line D2f and the second connection wire W2f. Alternatively, the advantageous effects of this example can be achieved either when the first data signal line D1f is smaller in resistance value than the second data signal line D2f, or when the first connection wire W1f is smaller in resistance value than the second connection wire W2f.

Figure 5:
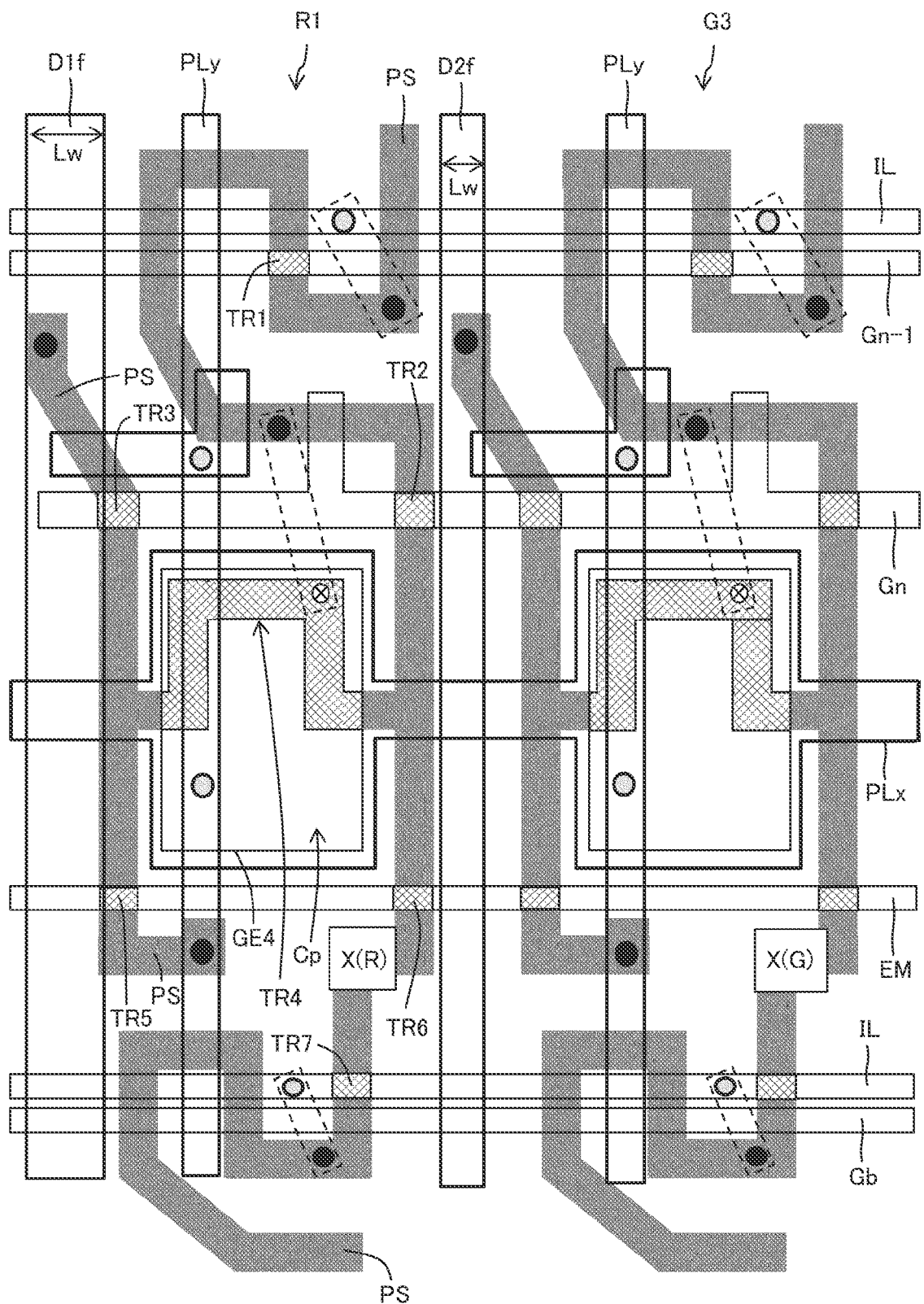
FIG. 5 is a plan view illustrating an exemplary configuration of a pixel circuit in the first embodiment.

FIG. 5 is a plan view illustrating an exemplary configuration of a pixel circuit in the first embodiment. In FIG. 5, the first pixel circuit R1 and the third pixel circuit G3 are arranged side by side in the row direction. Provided to correspond to the first pixel circuit R1 and the third pixel circuit G3 are: the first data signal line D1f; the second data signal line D2f; two first scan signal lines Gn; two each of high-voltage power source lines PLx and Ply; and two initialization power source lines IL The first scan signal line Gn, the light-emission control line EM, and the gate electrode GE of the drive transistor TR4 are formed in the first wiring layer. The high-voltage power source lines PLx extending in the row direction and the initialization power source lines IL are formed in the second wiring layer. The high-voltage power source lines PLy extending in the column direction, the first data signal line D1f, and the second data signal line D2f are formed in the third wiring layer. The first data signal line D1f is greater in width Lw than the second data signal line D2f.

The semiconductor layer PS has: a portion, which is a semiconductor, overlapping the first wiring layer (including the first scan signal line Gn, the light-emission control line EM, and a gate electrode GE4 of the drive transistor TR4), and serving as a channel of each transistor; and another portion not overlapping the first wiring layer and doped to be conductive.

Second Embodiment

Figure 6:
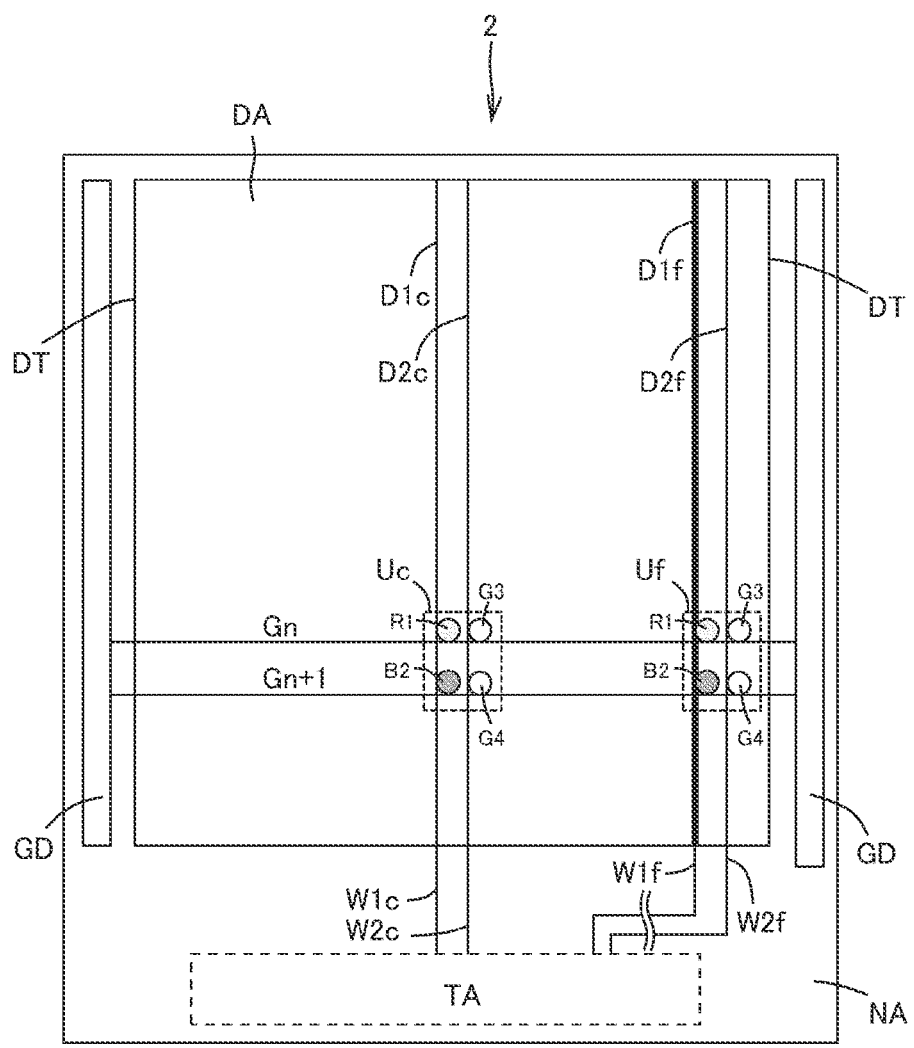
FIG. 6 is a plan view illustrating a configuration of the display device in a second embodiment.

FIG. 6 is a plan view illustrating a configuration of the display device in a second embodiment. In FIG. 6, the first data signal line D1f is wider than the first data signal line D2f. The first connection wire W1f is the same in width as the second connection wire W2f. That is, the sum of the resistance values of the first data signal line D1f and the first connection wire W1f is smaller than the sum of the resistance values of the second data signal line D2f and the second connection wire W2f.

Third Embodiment

Figure 7:
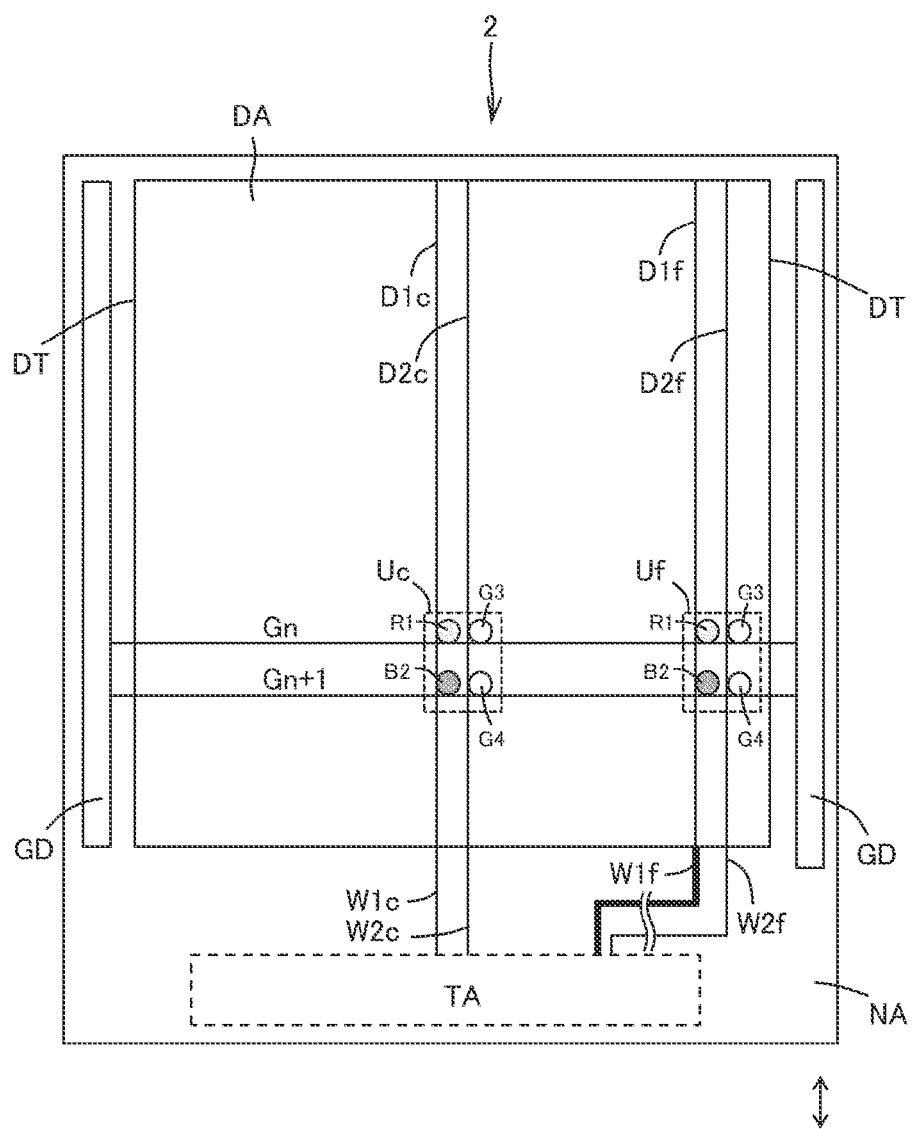
FIG. 7 is a plan view illustrating a configuration of the display device in a third embodiment.

FIG. 7 is a plan view illustrating a configuration of the display device in a third embodiment. In FIG. 7, the first data signal line D1f is the same in width as the first data signal line D2f. The first connection wire W1f is wider than the second connection wire W2f. That is, the sum of the resistance values of the first data signal line D1f and the first connection wire W1f is smaller than the sum of the resistance values of the second data signal line D2f and the second connection wire W2f.

First and Second Embodiments

Figure 8:
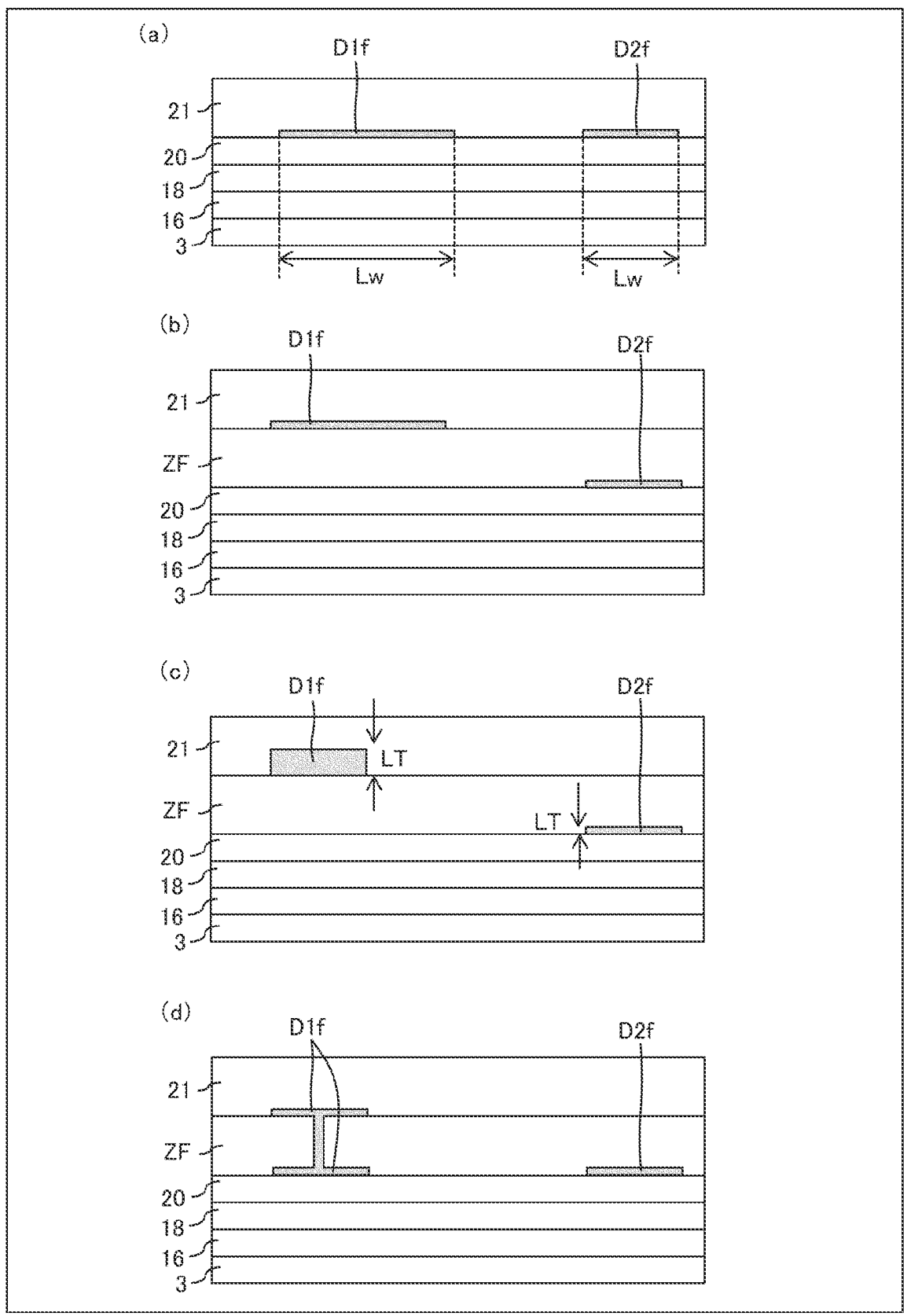
FIG. 8 is a cross-sectional view illustrating an exemplary configuration of data signal lines in a first group.

FIG. 8 is a cross-sectional view illustrating a configuration of data signal lines in a first group of the display device. As illustrated in FIG. 8(a), the first data signal line D1f and the second data signal line D2f are formed in the same layer (the third wiring layer), and the first data signal line D1f is formed greater in width Lw than the second signal line D2f. Such features make it possible to reduce the resistance value.

Note that, as illustrated in FIG. 8(b), a planarization film ZF may be formed between the second interlayer insulating film 20 and the planarization film 21. The first data signal line D1f may be formed in a fourth wiring layer on the planarization film ZF. The second data signal line D2f may be formed in the third wiring layer on the second interlayer insulating film 20. The first data signal line D1f may be formed wider than the second data signal line D2f. The anode of the light-emitting element X is formed on the planarization film 21.

Moreover, as illustrated in FIG. 8(c), the fourth wiring layer M4 on the planarization film ZF may be lower in sheet resistance than the third wiring layer M3. For example, the first data signal line D1f and the second data signal line D2f are formed the same in width, the fourth wiring layer is formed greater in thickness LT than the third wiring layer, the first data signal line D1f is formed in the fourth wiring layer, and the second data signal line D2f is formed in the third wiring layer. Utilizing such features, the resistance value of the first data signal line D1f may be reduced.

Furthermore, as illustrated in FIG. 8(d), the first data signal line D1f may be a multilayer wire including: a lower wire (the third wiring layer) formed on the second interlayer insulating film 20; and an upper wire (the fourth wiring layer) formed on the planarization film ZF. The upper wire and the lower wire are desirably connected together through a contact hole formed in the planarization film ZF. The multilayer wire (the upper wire and the lower wire) does not have to have an insulating film provided therein.

First and Third Embodiments

Figure 9:
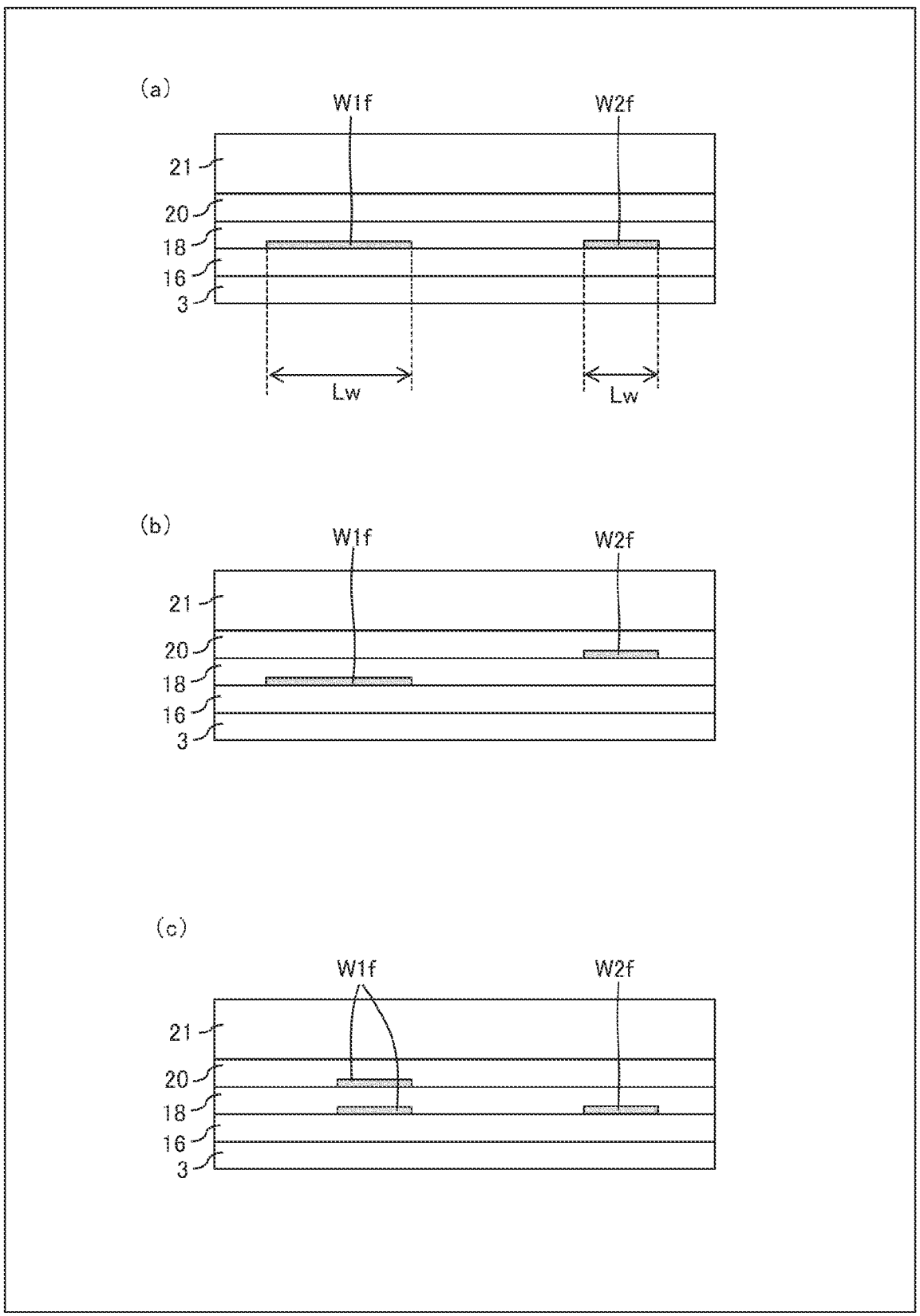
FIG. 9 is a cross-sectional view illustrating an exemplary configuration of connection wires in the first group.

FIG. 9 is a cross-sectional view illustrating a configuration of connection wires in the first group. The cross-sectional view illustrates a configuration of the frame region. As illustrated in FIG. 9(a), the first connection wire W1f and the second connection wire W2f are formed in the first wiring layer on the gate insulating film 16, and the first connection wire W1f is formed greater in width Lw than the second connection wire W2f. Such features make it possible to reduce the value of resistance.

Note that, as illustrated in FIG. 9(b), the second connection wire W2f may be formed in the second wiring layer on the first interlayer insulating film 18. Thanks to such a feature, the coupling capacitance between the first connection wire W1f and the third wiring layer may be reduced below the coupling capacitance between the second connection wire W2f and the third wiring layer.

Moreover, as illustrated in FIG. 9(c), the first connection wire W1f and the second connection wire W2f may be formed the same in width, and the first connection wire W1f may be a multilayer wire including: a lower wire formed in the first wiring layer on the gate insulating film 16; and an upper wire formed in the second wiring layer on the first interlayer insulating film 18. Utilizing such features, the value of resistance may be reduced. In this multilayer wire, the lower wire and the upper wire are electrically connected together through a contact hole formed in the first interlayer insulating film 18. Note that the multilayer wire (the upper wire and the lower wire) does not have to have an insulating film therein.

Modification of First Embodiment

Figure 10:
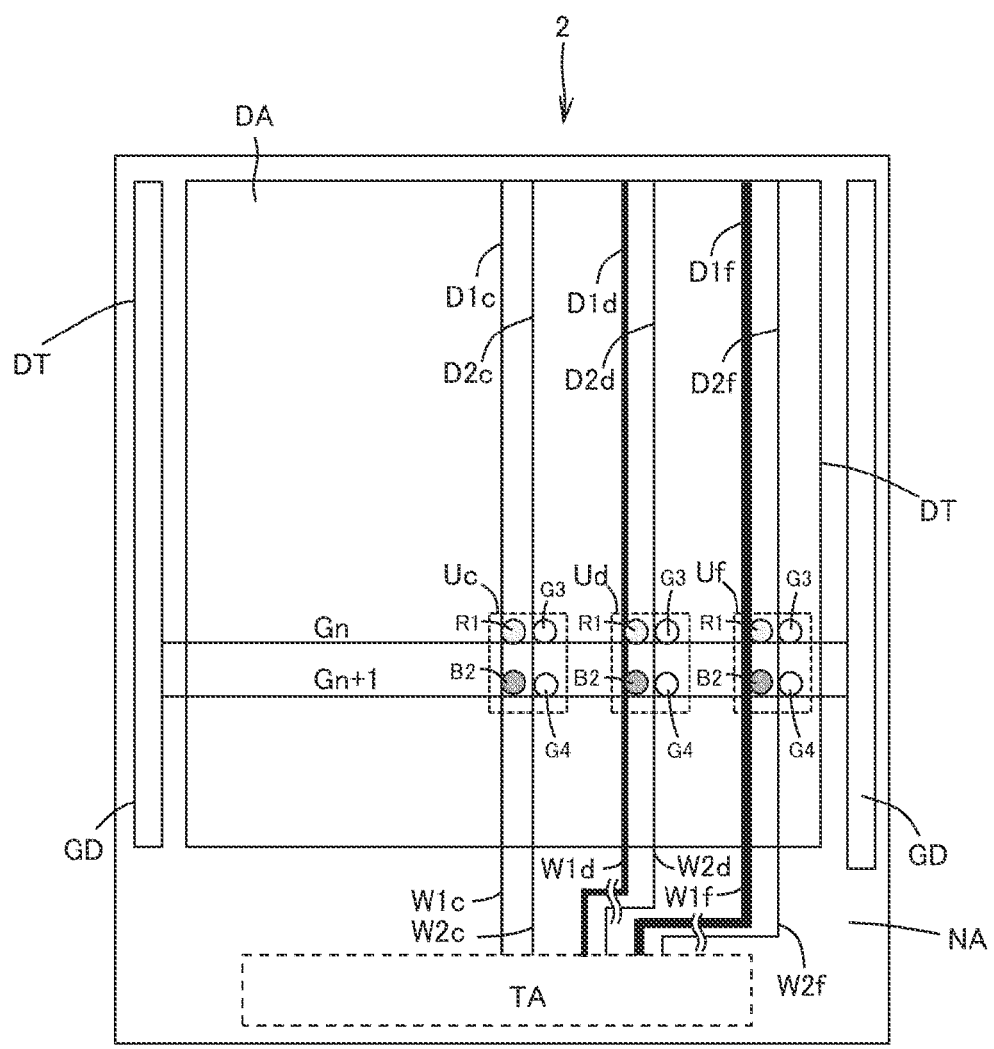
FIG. 10 is a plan view illustrating a modification of the display device in the first embodiment.

FIG. 10 is a plan view illustrating a modification of the display device in the first embodiment. In FIG. 10, the first group Uf, an intermediate group Ud, and the second group Uc are farther away in the row direction from a display region end DT in the stated order. Resistance values are smaller in the order of the first data signal line D1c in the second group, a first data signal line D1d in the intermediate group Ud, and the first data signal line D1f in the first group Uf. For example, widths are greater in the order of the first data signal line D1c, the first data signal line D1d, and the first data signal line D1f.

Moreover, resistance values are smaller in the order of the first connection wire W1c corresponding to the second group Uc, a first connection wire W1d corresponding to the intermediate group Ud, and the second connection wire W1f corresponding to the first group Uf. For example, widths are greater in the order of the first connection wire W1c, the first connection wire W1d, and the first connection wire W1f.

Furthermore, for each of the first group Uf, the intermediate group Ud, and the second group Uc, the first data signal lines D1f, D1d, and D1c are smaller in resistance value than the respective second data signal lines D2f, D2d, and D2c. For example, the first data signal lines D1 are wider than the respective second signal lines D2.

Moreover, for each of the first group Uf, the intermediate group Ud, and the second group Uc, the first connection wires W1f, W1d, and W1c are smaller in resistance value than the respective second connection wires W2f, W2d, and W2c. For example, the first connection wires W1 are wider than the respective second connection wires W2.

In addition, this modification is applicable to the above second and third embodiments, and modifications thereof. That is, the sum of the resistance values of a first data signal line and a first connection wire may be smaller as the first data signal line and the first connection wire are closer to the display region end DT.

Advantageous Effects

Figure 11:
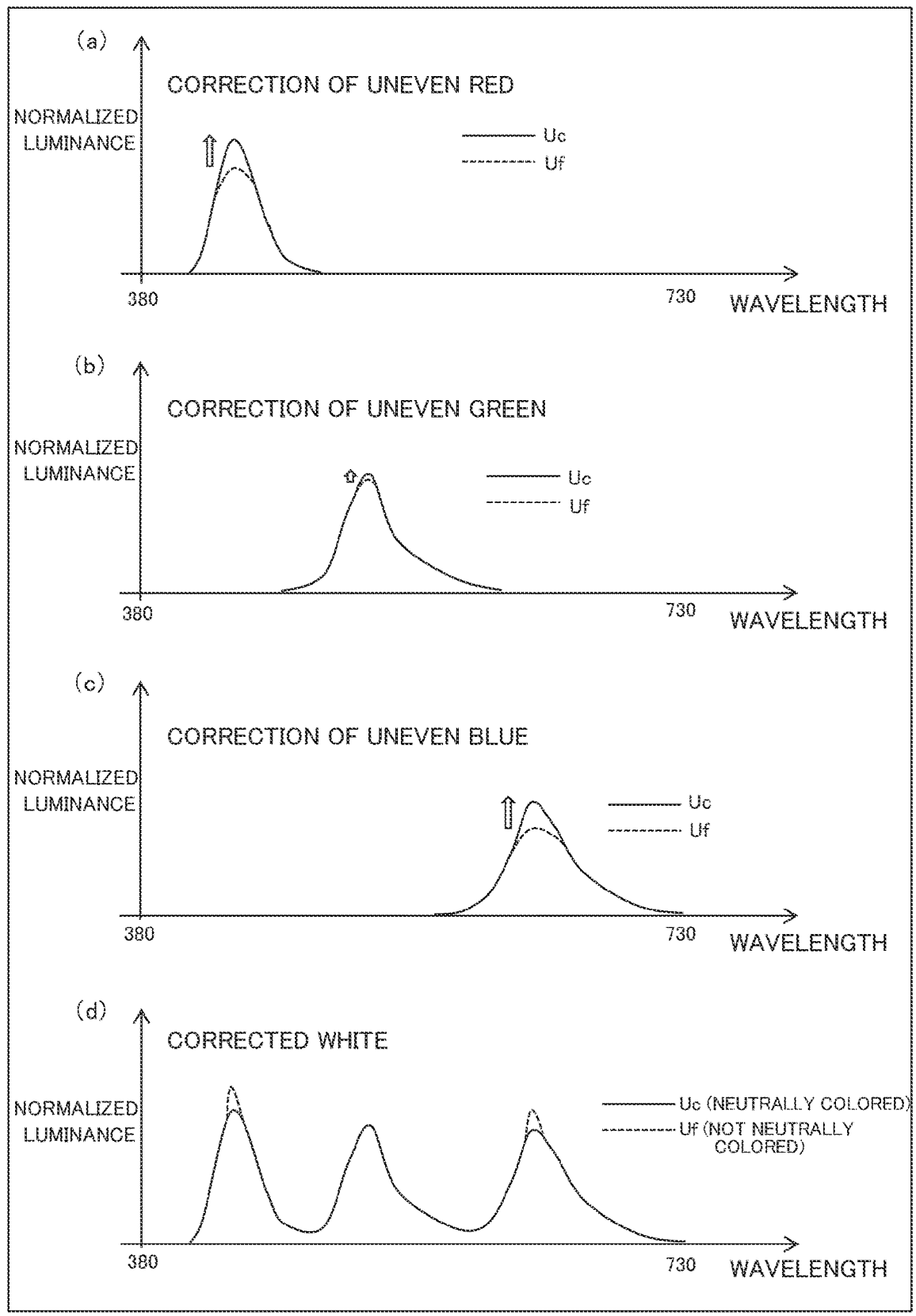
FIG. 11 illustrates graphs showing principles of how uneven color appears in a center and at an end of the display.
Figure 12:
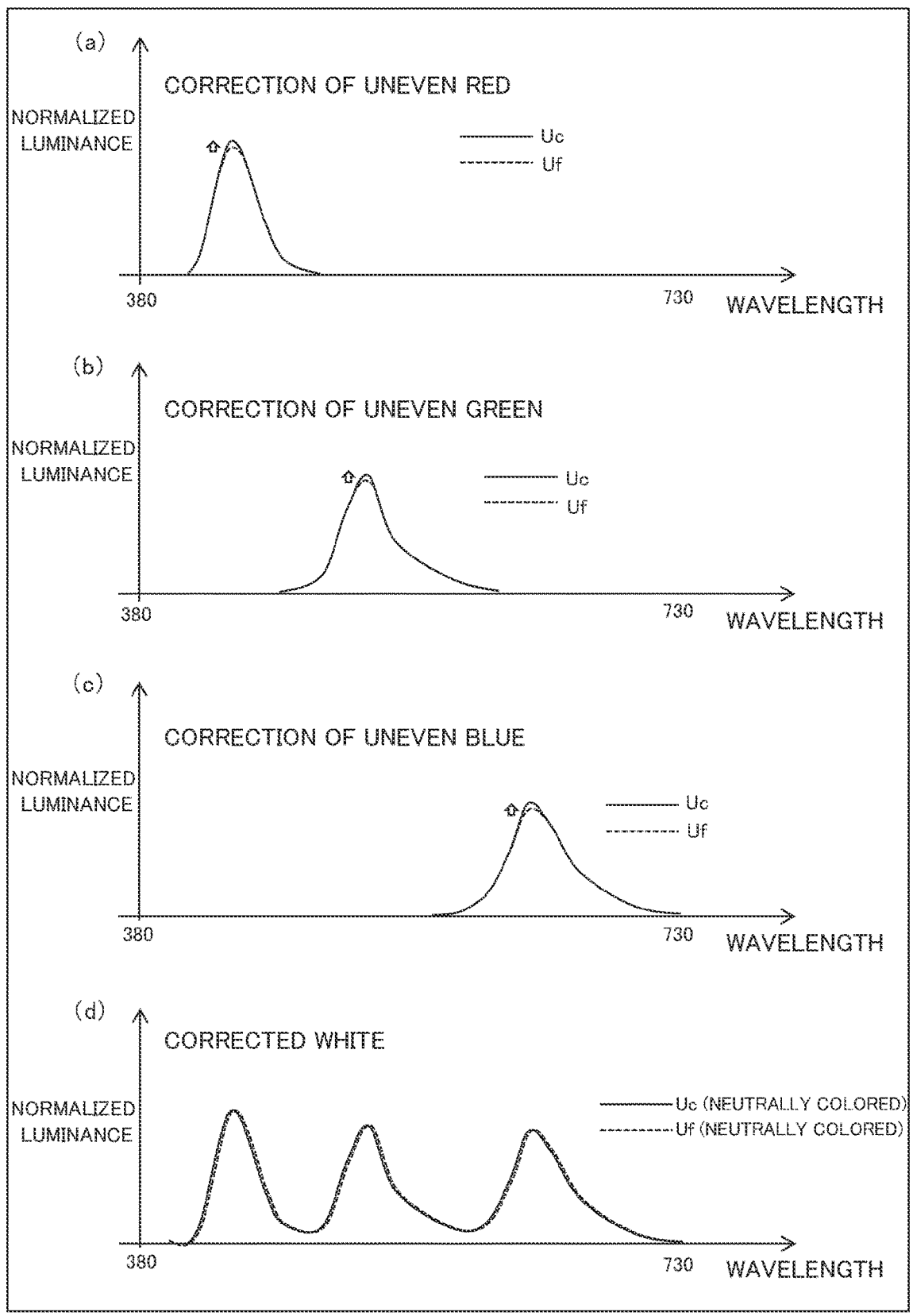
FIG. 12 illustrates graphs showing principles of how uneven color is reduced in the center and at the end of the display.

FIG. 11 illustrates graphs showing principles of how uneven color appears at an end (including the first group Uf) and in a center (including the second group Uc) of the display region. FIG. 12 illustrates graphs showing principles of how uneven color is reduced in the center and at the end of the display.

For example, when the first data signal lines are the same in width and the first connection wires are the same in width between the first group Uf and the second group Uc, the first connection wires in the first group Uf are longer in the frame region NA. Hence, the sum of the resistance values of the first data signal lines and the first connection wires is great, so that the AC waveform of the data signal is likely to be dull. Hence, as illustrated in FIG. 11(a) to FIG. 11(c), when the luminance of the first group Uf is corrected to match the luminance of the second group Uc for each of the colors, the red data signal and the blue data signal in the first group Uf are to be corrected to a great degree.

When white is presented after the correction, the white balance is lost (e.g. the red light and the blue light shift toward a higher luminance range) in the first group Uf because the data signal of the first data signal line has a DC waveform. Accordingly, the first group Uf can appear darker (e.g. purplish) than the second group Uc.

In the configuration illustrated in FIG. 10, the resistance values are smaller in the order of: the first data signal line D1c in the second group Uc, the first data signal line D1d in the intermediate group Ud, and the first data signal line D1f in the first group Uf; and the first connection wire W1c corresponding to the second group Uc, the first connection wire W1d corresponding to the intermediate group Ud, and the second connection wire W1f corresponding to the first group Uf. Hence, as illustrated in FIG. 12(a) to FIG. 12(c), when the luminance of the first group Uf is corrected to match the luminance of the second group Uc for each of the colors, the red data signal and the blue data signal in the first group Uf are to be corrected to a small degree. Such features keep from presenting the first group UF in non-neutral coloring, and make it almost impossible to visually recognize the difference in coloring between the first group Uf and the second group Uc.

The above embodiments are intended for exemplification and description, and not for limitation, of the present disclosure. It is clear for those skilled in the art that many modifications are available in accordance with the exemplification and description.

First Aspect

A display device includes: a display region, a frame region provided to surround the display region, and a terminal unit provided to an end of the frame region;
a plurality of data signal lines extending in a column direction, and a plurality of scan signal lines intersecting with the data signal lines and extending in a row direction;
a scan control circuit included in the frame region and provided along at least one side of the display region in the column direction, the scan control circuit inputting scan signals into the scan signal lines; and
a plurality of pixel circuits provided to correspond to the intersections of the data signal lines and the scan signal lines.

The pixel circuits include a plurality of groups each including: a first pixel circuit glowing in a first color; a second pixel circuit adjacent to the first pixel circuit and glowing in a second color different from the first color; a third pixel circuit adjacent to the first pixel circuit and glowing in a third color different from the first color and the second color; and a fourth pixel circuit adjacent to the third pixel circuit and glowing in the third color.

In each of the groups, the first pixel circuit and the second pixel circuit are connected to a first data signal line, the third pixel circuit and the fourth pixel circuit are connected to a second data signal line, the first pixel circuit and the third pixel circuit are connected to a first scan signal line, the second pixel circuit and the fourth pixel circuit are connected to a second scan signal line, the first data signal line is connected to a first connection wire provided to the frame region, the second data signal is connected to a second connection wire provided to the frame region, the first data signal line and the second data signal line are included in the data signal lines, and the first scan signal line and the second scan signal line are included in the scan signal lines.

The groups include a first group to which the first data signal line, the first connection wire, the second data signal line, and the second connection wire correspond. A sum of resistance values of the first data signal line and the first connection wire is smaller than a sum of resistance values of the second data signal line and the second connection wire.

Second Aspect

In the display device according to, for example, the first aspect, the groups include a second group farther away from an end of the display region in the row direction than the first group is. The first data signal line corresponding to the first group is smaller in resistance value than the first data signal line corresponding to the second group.

Third Aspect

In the display device according to, for example, the second aspect, in the first group, the first data signal line is smaller in resistance value than the second data signal line.

Fourth Aspect

In the display device according to, for example, the second aspect, the first data signal line, corresponding to a group closer to the end of the display in the row direction, is smaller in resistance value. The group is included in the groups.

Fifth Aspect

In the display device according to, for example, the first aspect, the groups include a second group farther away from an end of the display region in the row direction than the first group is. The first connection wire corresponding to the first group is smaller in resistance value than the first connection wire corresponding to the second group.

Sixth Aspect

In the display device according to, for example, the fifth aspect, the first connection wire, corresponding to a group closer to the end of the display in the row direction, is smaller in resistance value. The group is included in the groups.

Seventh Aspect

In the display device according to, for example, the first aspect, the groups include a second group farther away from an end of the display region in the row direction than the first group is.

The first data signal line corresponding to the first group is the same in resistance value as the first data signal line corresponding to the second group.

The first data signal line corresponding to the second group is smaller in resistance value than the second data signal line corresponding to the second group.

Eighth Aspect

In the display device according to, for example, the first aspect, the groups include a second group farther away from an end of the display region in the row direction than the first group is.

The first connection wire corresponding to the first group is the same in resistance value as the first connection wire corresponding to the second group.

The first connection wire corresponding to the second group is smaller in resistance value as the second connection wire corresponding to the second group.

Ninth Aspect

In the display device according to, for example, any one of the first to eighth aspects, the first group is positioned at an end of the display region in the row direction.

Tenth Aspect

In the display device according to, for example, any one of the first to eighth aspects, in the first group, the first data signal line is wider than the second data signal line.

Eleventh Aspect

In the display device according to, for example, any one of the first to tenth aspects, in the first group, the first connection wire is wider than the second connection wire.

Twelfth Aspect

The display device according to, for example, any one of the first to eleventh aspects further includes: a first wiring layer; a first interlayer insulating film; a second wiring layer; a second interlayer insulating film; a third wiring layer; and a planarization film, all of which are provided on a substrate in a stated order.

In each of the groups, the second data signal line is included in the third wiring layer, the first connection wire is included in the first wiring layer or the second wiring layer, and the second connection wire is included in the first wiring layer or the second wiring layer.

Thirteenth Aspect

In the display device according to, for example, the twelfth aspect, in each of the groups, the first data signal line is included in the third wiring layer.

Fourteenth Aspect

In the display device according to, for example, the twelfth aspect, in each of the groups, the first connection wire is included in the first wiring layer, and the second connection wire is included in the second wiring layer.

Fifteenth Aspect

In the display device according to, for example, the twelfth aspect, in the first group, the first connection wire is a multilayer wire including: a wire included in the first wiring layer; and a wire included in the second wiring layer.

Sixteenth Aspect

The display device according to, for example, any one of the twelfth to fifteenth aspects further includes a fourth wiring layer provided on the planarization film.

In the first group, the first data signal line is included in the fourth wiring layer.

Seventeenth Aspect

In the display device according to, for example, the sixteenth aspect, in the first group, the first data signal line included in the fourth wiring layer is wider than the second data signal line.

Eighteenth Aspect

In the display device according to, for example, the seventeenth aspect, in the first group, the first data signal line is a multilayer wire including: a wire included in the third wiring layer; and a wire included in the fourth wiring layer.

Nineteenth Aspect

In the display device according to any one of the first to eighteenth aspects, the first color is red, the second color is blue, and the third color is green.

Reference Signs List

The invention claimed is:

1. A display device, comprising:
a display region, a frame region provided to surround the display region, and a terminal unit provided to an end of the frame region;
a plurality of data signal lines extending in a column direction, and a plurality of scan signal lines intersecting with the data signal lines and extending in a row direction;
a scan control circuit included in the frame region and provided along at least one side of the display region in the column direction, the scan control circuit being configured to input scan signals into the scan signal lines; and
a plurality of pixel circuits provided to correspond to the intersections of the data signal lines and the scan signal lines,
the pixel circuits including a plurality of groups each including: a first pixel circuit configured to glow in a first color; a second pixel circuit adjacent to the first pixel circuit and configured to glow in a second color different from the first color; a third pixel circuit adjacent to the first pixel circuit and configured to glow in a third color different from the first color and the second color; and a fourth pixel circuit adjacent to the third pixel circuit and configured to glow in the third color,
in each of the groups, the first pixel circuit and the second pixel circuit being connected to a first data signal line, the third pixel circuit and the fourth pixel circuit being connected to a second data signal line, the first pixel circuit and the third pixel circuit being connected to a first scan signal line, the second pixel circuit and the fourth pixel circuit being connected to a second scan signal line, the first data signal line being connected to a first connection wire provided to the frame region, the second data signal line being connected to a second connection wire provided to the frame region, the first data signal line and the second data signal line being included in the data signal lines, and the first scan signal line and the second scan signal line being included in the scan signal lines, and
the groups including a first group to which the first data signal line, the first connection wire, the second data signal line, and the second connection wire correspond, and a sum of resistance values of the first data signal line and the first connection wire being smaller than a sum of resistance values of the second data signal line and the second connection wire.

2. The display device according to claim 1, wherein
the groups include a second group farther away from an end of the display region in the row direction than the first group is, and the first data signal line corresponding to the first group is smaller in resistance value than the first data signal line corresponding to the second group.

3. The display device according to claim 2, wherein
in the first group, the first data signal line is smaller in resistance value than the second data signal line.

4. The display device according to claim 2, wherein
the first data signal line, corresponding to a group closer to the end of the display in the row direction, is smaller in resistance value, the group being included in the groups.

5. The display device according to claim 1, wherein
the groups include a second group farther away from an end of the display region in the row direction than the first group is, and the first connection wire corresponding to the first group is smaller in resistance value than the first connection wire corresponding to the second group.

6. The display device according to claim 5, wherein
the first connection wire, corresponding to a group closer to the end of the display in the row direction, is smaller in resistance value, the group being included in the groups.

7. The display device according to claim 1, wherein
the groups include a second group farther away from an end of the display region in the row direction than the first group is,
the first data signal line corresponding to the first group is the same in resistance value as the first data signal line corresponding to the second group, and
the first data signal line corresponding to the second group is smaller in resistance value than the second data signal line corresponding to the second group.

8. The display device according to claim 1, wherein
the groups include a second group farther away from an end of the display region in the row direction than the first group is,
the first connection wire corresponding to the first group is the same in resistance value as the first connection wire corresponding to the second group, and
the first connection wire corresponding to the second group is smaller in resistance value as the second connection wire corresponding to the second group.

9. The display device according to claim 1, wherein
the first group is positioned at an end of the display region in the row direction.

10. The display device according to claim 1, wherein
in the first group, the first data signal line is wider than the second data signal line.

11. The display device according to claim 1, wherein
in the first group, the first connection wire is wider than the second connection wire.

12. The display device according to claim 1, further comprising:
a first wiring layer; a first interlayer insulating film; a second wiring layer; a second interlayer insulating film; a third wiring layer; and a planarization film, all of which are provided on a substrate in a stated order, wherein
in each of the groups, the second data signal line is included in the third wiring layer, the first connection wire is included in the first wiring layer or the second wiring layer, and the second connection wire is included in the first wiring layer or the second wiring layer.

13. The display device according to claim 12, wherein
in each of the groups, the first data signal line is included in the third wiring layer.

14. The display device according to claim 12, wherein
in each of the groups, the first connection wire is included in the first wiring layer, and the second connection wire is included in the second wiring layer.

15. The display device according to claim 12, wherein
in the first group, the first connection wire is a multilayer wire including: a wire included in the first wiring layer; and a wire included in the second wiring layer.

16. The display device according to claim 12, further comprising
a fourth wiring layer provided on the planarization film, wherein
in the first group, the first data signal line is included in the fourth wiring layer.

17. The display device according to claim 16, wherein
in the first group, the first data signal line included in the fourth wiring layer is wider than the second data signal line.

18. The display device according to claim 17, wherein
in the first group, the first data signal line is a multilayer wire including: a wire included in the third wiring layer; and a wire included in the fourth wiring layer.

19. The display device according to claim 1, wherein
the first color is red, the second color is blue, and the third color is green.

* * * * *